US008461553B2

(12) United States Patent
Bateman et al.

(10) Patent No.: US 8,461,553 B2
(45) Date of Patent: Jun. 11, 2013

(54) MASKED ION IMPLANT WITH FAST-SLOW SCAN

(75) Inventors: Nicholas P. T. Bateman, Reading, MA (US); Steven M. Anella, West Newbury, MA (US); Benjamin B. Riordon, Newburyport, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 179 days.

(21) Appl. No.: 13/188,837

(22) Filed: Jul. 22, 2011

(65) Prior Publication Data

US 2011/0272602 A1 Nov. 10, 2011

Related U.S. Application Data

(62) Division of application No. 12/853,698, filed on Aug. 10, 2010, now Pat. No. 8,008,176.

(60) Provisional application No. 61/232,821, filed on Aug. 11, 2009.

(51) Int. Cl.
*H01J 37/317* (2006.01)
*H01J 37/244* (2006.01)
*H01J 3/07* (2006.01)
*G21K 5/10* (2006.01)

(52) U.S. Cl.
USPC ............... 250/492.21; 250/491.1; 250/492.2; 250/492.3; 250/398; 250/397; 250/396 R; 438/531; 438/308; 438/378; 438/795

(58) Field of Classification Search
USPC ................... 250/492.21, 492.2, 491.1, 492.3, 250/398, 397, 396 R; 438/531, 308, 378, 438/795

See application file for complete search history.

(56) References Cited

U.S. PATENT DOCUMENTS

| 4,476,393 | A | 10/1984 | Taya et al. |
| 6,991,878 | B2 * | 1/2006 | Kanamitsu et al. ............... 430/5 |
| 8,008,176 | B2 * | 8/2011 | Bateman et al. ............... 438/531 |
| 8,164,068 | B2 * | 4/2012 | Riordon et al. ............... 250/397 |
| 8,173,527 | B2 * | 5/2012 | Riordon et al. ............... 438/531 |
| 2008/0038908 | A1 | 2/2008 | Henley |

FOREIGN PATENT DOCUMENTS

| DE | 2835136 A1 | 2/1980 |
| WO | 2009033134 A2 | 3/2009 |

OTHER PUBLICATIONS

Nishihashi, T., et al., Ion-graphy implanter with stencil mask, Journal of Vacuum Science and Technology: Part B, May 1, 2002, pp. 914-917, vol. 20, No. 3, AVS/AIP, Melville, New York, US.

* cited by examiner

*Primary Examiner* — Nikita Wells

(57) ABSTRACT

An improved method of producing solar cells utilizes a mask which is fixed relative to an ion beam in an ion implanter. The ion beam is directed through a plurality of apertures in the mask toward a substrate. The substrate is moved at different speeds such that the substrate is exposed to an ion dose rate when the substrate is moved at a first scan rate and to a second ion dose rate when the substrate is moved at a second scan rate. By modifying the scan rate, various dose rates may be implanted on the substrate at corresponding substrate locations. This allows ion implantation to be used to provide precise doping profiles advantageous for manufacturing solar cells.

6 Claims, 5 Drawing Sheets

MASKED ION IMPLANT WITH FAST-SLOW SCAN

RELATED APPLICATIONS

This patent application is a division of U.S. patent application Ser. No. 12/853,698 filed Aug. 10, 2010, which claims priority to U.S. Provisional Patent Application. Ser. No. 61/232,821 filed Aug. 11, 2009, both of which are hereby incorporated by reference in their entirety.

BACKGROUND OF THE INVENTION

1. Field of the Invention

Embodiments of the invention relate to the field of device fabrication. More particularly, the present disclosure relates to a scanning method for ion implantation utilizing a shadow mask.

2. Discussion of Related Art

Ion implantation is a standard technique for introducing conductivity-altering impurities into substrates. A precise doping profile in a substrate and associated thin film structure is critical for proper device performance. Generally, a desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Such an ion implanter may be used to form solar cells. Solar cells are typically manufactured using the same processes used for other semiconductor devices, often using silicon as the substrate material. A semiconductor solar cell has an in-built electric field that separates the charge carriers generated through the absorption of photons in the semiconductor material. This electric-field is typically created through the formation of a p-n junction (diode) which is created by differential doping of the semiconductor material. Doping a part of the semiconductor substrate (e.g. surface region) with impurities of opposite polarity forms a p-n junction that may be used as a photovoltaic device converting light into electricity. These solar cells provide pollution-free, equal-access energy using a recurring natural resource. Due to environmental concerns and rising energy costs, solar cells are becoming more globally important. Reducing cost to manufacture or increasing production capability of these high-performance solar cells or other efficiency improvement to high-performance solar cells would have a positive impact on the implementation of solar cells worldwide. This will enable the wider availability of this clean energy technology.

Solar cells may require doping to improve efficiency. This may be seen in FIG. 1 which is a cross-sectional view of a selective emitter solar cell. It may increase efficiency of a solar cell to dope the emitter 200 and provide additional dopant to the regions 201 under the contacts 202. More heavily doping the regions 201 improves conductivity and having less doping between the contacts 202 improves charge collection. The contacts 202 may only be spaced approximately 2-3 mm apart. The regions 201 may only be approximately 50-300 µm across.

FIG. 2 is a cross-sectional view of an interdigitated back contact (IBC) solar cell. In the IBC solar cell, the junction is on the back of the solar cell. The doping pattern is alternating p-type and n-type dopant regions in this particular embodiment. The p+ emitter 203 and the n+ back surface field 204 may be doped. This doping may enable the junction in the IBC solar cell to function or have increased efficiency.

In the past, solar cells have been doped using a dopant-containing glass or a paste that is heated to diffuse dopants into the solar cell. This does not allow precise doping of the various regions of the solar cell and, if voids, air bubbles, or contaminants are present, non-uniform doping may occur. Solar cells could benefit from ion implantation because ion implantation allows precise doping of the solar cell. Ion implantation of solar cells, however, may require a certain pattern of dopants or that only certain regions of the solar cell substrate are implanted with ions. Previously, implantation of only certain regions of a substrate has been accomplished using photoresist and ion implantation. However, use of photoresist, adds an extra cost to solar cell production because extra process steps are involved. Other hard masks on the solar cell surface are expensive and likewise require extra process steps. There are advantages in implanting small, regions of solar cells and having a lower sheet resistance between implanted regions to improve series resistance. Both may be accomplished through the use of ion implantation. Accordingly, there is a need in the art for an improved method of implanting through a shadow mask and, more particularly, a scanning method for ion implantation that uses a shadow mask with solar cell fabrication.

SUMMARY OF THE INVENTION

Exemplary embodiments of the present invention are directed to an apparatus and method for implanting ions into a substrate in an ion implanter. In an exemplary method, an ion beam is directed through an aperture of a shadow mask toward a substrate support configured to support a target substrate. A first portion of the substrate aligned with the aperture the mask is exposed to the ion beam. The substrate support is moved with respect to the ion beam at a first scan rate when the first portion of the substrate is exposed to the ion beam. A second portion of the substrate aligned with the aperture of the mask is exposed to the ion beam. The substrate support is moved with respect to the ion beam at a second scan rate when second portion of the substrate is exposed to the ion beam, wherein the first scan rate and the second scan rate are different.

In an exemplary embodiment, an ion implanter includes an ion source, a beam line assembly, a shadow mask and a scanning assembly. The beam line assembly is configured to extract ions from the ion source to form an ion beam and direct the ion beam toward a substrate disposed on a substrate support. The mask is disposed in front of the substrate and has a plurality of apertures to allow respective portions of the ion beam through the mask toward the substrate. The scanning assembly is configured to move the substrate with respect to the ion beam at a first scan rate when first portions of the substrate are aligned with the plurality of apertures and at a second scan rate when second portions of the substrate are aligned with the plurality of apertures.

DETAILED DESCRIPTION

Figure 1:
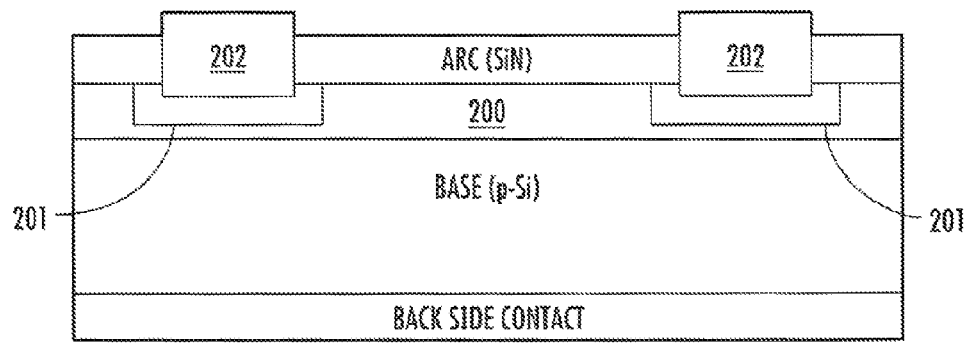
FIG. 1 is a cross-sectional view of a selective emitter solar cell.
Figure 2:
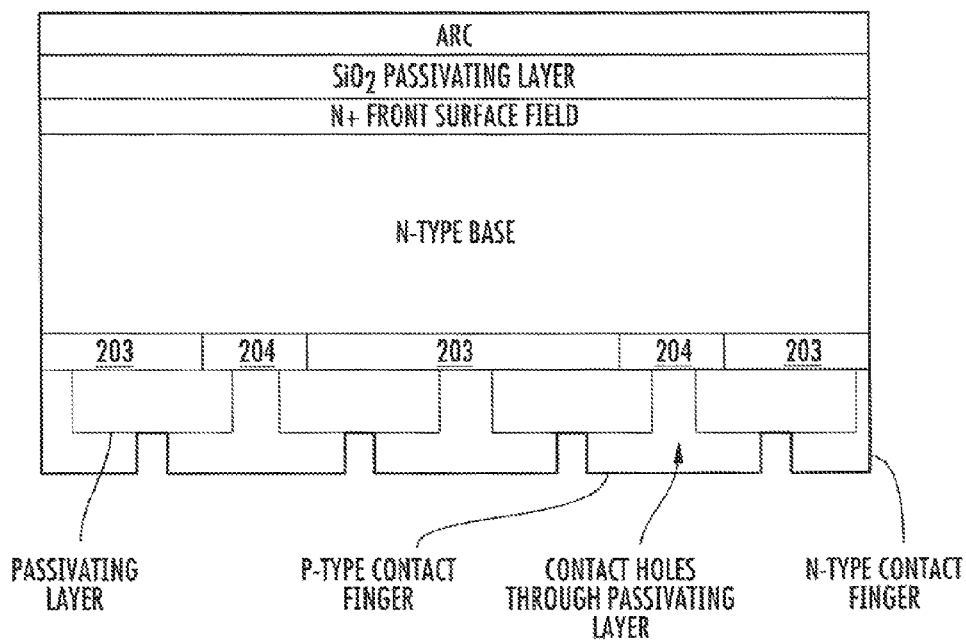
FIG. 2 is a cross-sectional view of an interdigitated back contact solar cell.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3A:
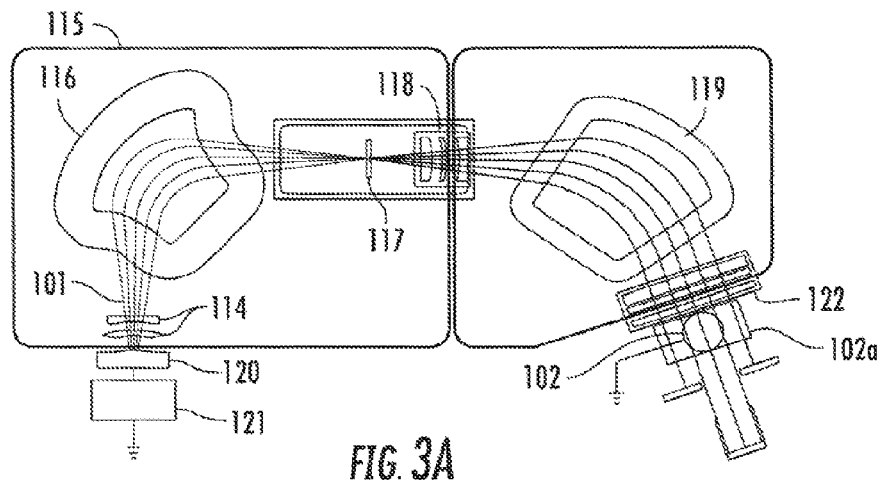
FIG. 3A is a block diagram of a representative ion implanter with accordance with an embodiment of the present disclosure.

FIG. 3A is a block diagram of an ion implanter 115 including an ion source chamber 120. A power supply 121 supplies the required energy to source chamber 120 which is configured to generate ions of a particular species. The generated ions are extracted from the source through a series of electrodes 114 and formed into a beam 101 which passes through a mass analyzer magnet 116. The mass analyzer is configured with a particular magnetic field such that only the ions with a desired mass-to-charge ratio are able to travel through the analyzer for maximum transmission through the mass resolving slit 117. Ions of the desired species pass from mass slit 117 through deceleration stage 118 to corrector magnet 119. Corrector magnet 119 is energized to deflect ion beamlets in accordance with the strength and direction of the applied magnetic field to provide a ribbon beam targeted toward a work piece or substrate (100 in FIG. 3B) positioned on support (e.g. platen) 102. In some embodiments, a second deceleration stage 122 may be disposed between corrector magnet 119 and support 102. The ions lose energy when they collide with electrons and nuclei in the substrate and come to rest at a desired depth within the substrate based on the acceleration energy. A mask 104 (shown in FIG. 3b) is disposed proximate the substrate (shown in FIG. 3b at 100) in a process chamber which houses platen 102. The mask 104 may be referred to herein as a shadow or proximity mask. The mask has a plurality of apertures (105 in FIG. 3B which allows portions of the ion beam aligned with the apertures to travel towards the substrate and blocks portions of the ion beam not aligned with the apertures 105.

The ion beam 101 has a height (Y direction) that is smaller than its width (X direction) as it travels toward the substrate (in the Z direction). Since the height of the ion beam is smaller than the width, only a portion of the substrate is exposed to the ion beam. Thus, in order to scan entire substrate, the ion beam 101 (and consequently the mask 104) must move relative to the substrate or the substrate must be moved relative to the ion beam 101. However, if the ion beam and mask move in order to scan the surface of the substrate, complicated cooling and grounding connections must accommodate this scanning movement in the process chamber where space is already at a premium. Thus, it is less complicated to move the substrate with respect to the ion beam 101. A scanning assembly 102a is coupled to platen 102 and is configured to move the substrate with respect to the ion beam. In particular, the scanning assembly moves the substrate at a first scan rate when first portions of said substrate are aligned with the plurality of apertures and at a second scan rate when second portions of said substrate are aligned with said plurality of apertures.

The scanning assembly is used to move the substrate at a variable speed in the Y direction as the ion beam implants a desired ion dose amount on the substrate. Alternatively, the scanning assembly can move the substrate at a variable speed in the X direction as the ion beam implants a desired ion dose amount on the substrate. In this manner, the scanning speed may slow down to have longer dwell times at particular portions of the substrate to heavily dope contact regions of a solar cell and move faster to have shorter dwell times to lightly dope exposed emitter regions of the cell.

Figure 3B:
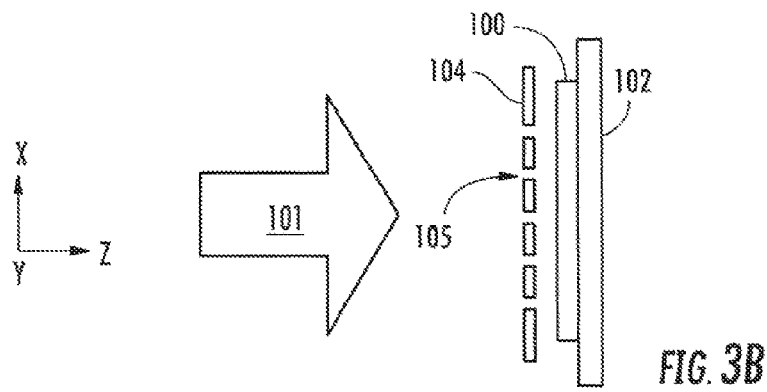
FIG. 3B is a cross-sectional view of implantation through a shadow mask.

FIG. 3B is a cross-sectional view of implantation through a mask. When a specific pattern of implantation in a substrate 100 is desired, a mask 104 may be placed in front of a substrate 100 in the path of an ion beam 101. This mask 104 may be a shadow or proximity mask. The substrate 100 may be, for example, a solar cell placed on platen 102 Typical substrates used for solar cells are very thin, often on the order of 300 microns thick or less. The substrate 100 is retained in position on the platen 102 using electrostatic or physical forces. Although not required, it is preferable that the width of the substrate in the X direction is less than the width of the ion beam 101. However, no such limitation is preferred with respect to the orthogonal direction of the substrate.

The mask 104 has one or more apertures 105 that correspond to the desired pattern of ion implantation. Use of the shadow mask 104 eliminates process steps, such as screen printing or lithography, required for other ion implantation techniques. As previously stated, there is an advantage to having high dopant levels under the contact portions of the solar cell, such as seen in the regions 201 in FIG. 1. While a selective emitter solar cell is discussed, embodiments of this method may be applied to other solar cell designs. Point contacts will minimize the metal-to-silicon contact area. For these point contacts, dopant should be localized under the contacts 202 to provide an electrical field to shield the contacts from minority carriers. The dopant must be localized because highly-doped regions are detrimental under the passivated surfaces that may exist between the contacts 202.

Point contacts may be doped by implanting through a mask that has points on it. However, the series resistance of a solar cell with such a doping structure may still be limited by the amount of dopant between the contacts 202. In an implant through the mask 104, the mask 104 must travel with the substrate 100 when the substrate 100 is scanned. As mentioned above, this movement increases the difficulty in cooling and grounding the mask 104. Additionally, a mask 104 with small apertures 105 will block much of the ion beam 103 which decreases productivity and device throughput.

A fixed mask 104 having a plurality of apertures 105 is configured to cover the height (Y direction) of the ion beam 101. This may be, for example, the height of a ribbon ion beam 101 or the maximum and minimum vertical extent of a scanned ion beam 101. Such a design provides positional definition in one dimension, such as the dimension in which the ion beam 101 is scanned (e.g. Y direction) or the long dimension of a ribbon ion beam 101 (e.g. X direction). Positional definition in a second dimension, such as the direction in which the substrate 100 is scanned, is provided by changing the scan speed of the substrate 100.

Figure 4:
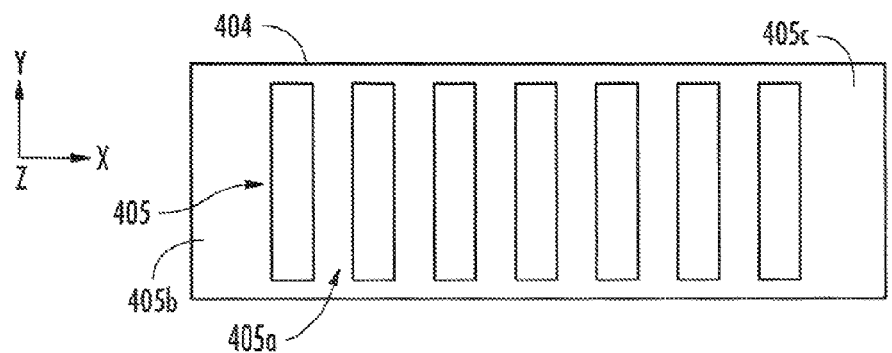
FIG. 4 is a front perspective view of a shadow mask.

FIG. 4 is a front perspective view of a shadow mask 404 having seven apertures 405 and is fixed (i.e., does not translate or scan) with respect to the ion beam 101. While seven apertures 405 are illustrated, the mask 404 is not solely limited to seven apertures 405 and other numbers are possible. An ion beam, such as ion beam 101, is incident on the mask 404 throughout the implant process and the mask 404 is stationary or fixed relative to this ion beam. The substrate 100 is scanned behind the mask 404. Portions of the mask 405a defined between the apertures 404 and at the ends of the mask 405b and 405c block ion beam from implanting on the substrate 100.

Figure 5:
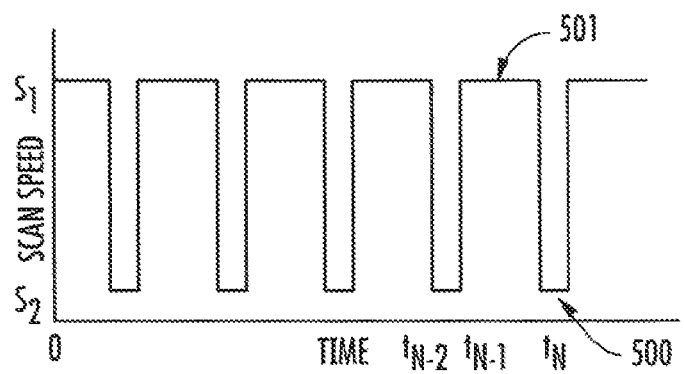
FIG. 5 is example of a velocity profile for a substrate in accordance with an embodiment of the present disclosure.

FIG. 5 is example of a corresponding scanning velocity profile for an exemplary substrate. This velocity profile has the substrate 100 moving for a large percentage of the velocity profile at a first speed, but the substrate 100 slows down to a second speed when the ion beam 101 is on each of the five evenly-spaced locations on the substrate 100. In particular, the substrate 100 moves at a first speed $S_1$ for an exemplary time interval defined between $t_N$ and $t_{N-1}$ represented by reference 501. The movement speed of substrate 100 changes to speed $S_2$ for an exemplary time interval defined between $t_{N-1}$ and $t_{N-2}$ represented by reference 500. Since the scan speed at $S_1$ is slower than the scan speed $S_2$, the dose rate of ions from ion beam 101 on the surface of substrate 100 at speed $S_2$ will be lower since the substrate is moving faster through the ion beam. Thus, the dose implanted between these five locations on substrate 100 (represented by 501) will be lower than the dose at the five locations on the substrate (represented by 500) because of the higher scan speed $S_1$. This may be used to align the higher dose rate locations of the substrate to the point metal contacts on an exemplary solar cell.

Figure 6A:
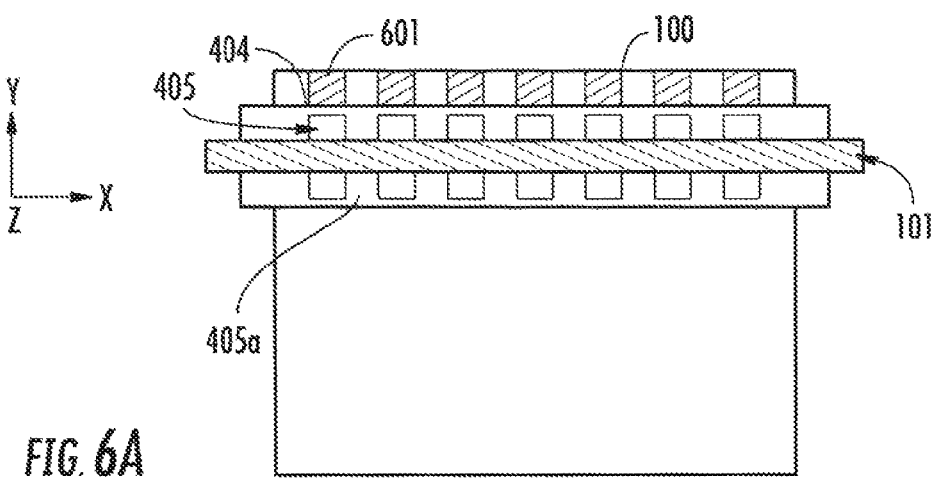
FIGS. 6A-6E represent the implant method corresponding to the velocity profile of FIG. 5 in accordance with an embodiment of the present disclosure.
Figure 6B:
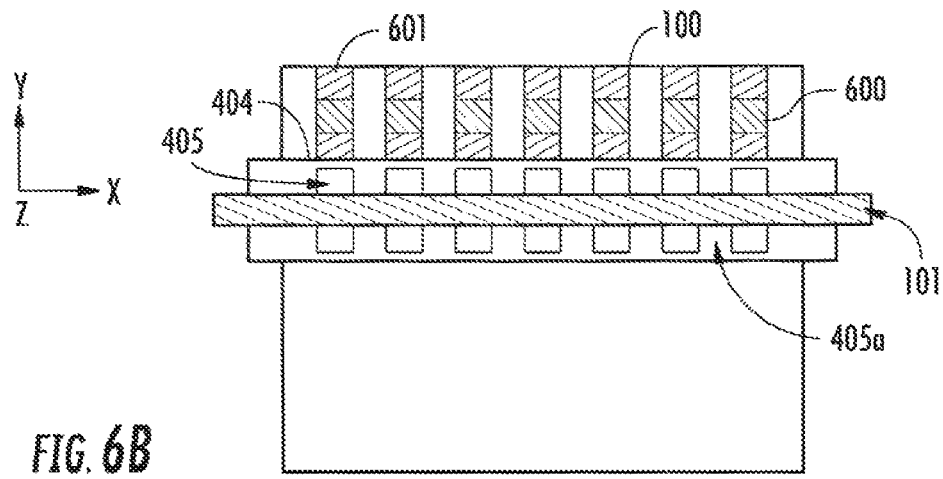

FIGS. 6A-6E illustrate results of the implant method corresponding to the velocity profile of FIG. 5. In FIG. 6A the ion beam 101 implants substrate 100 through the apertures 405 in the mask 404 in a first position. Lower dose regions 601 correspond to that portion of the velocity profile of FIG. 5 where the scan speed is faster ($S_1$). In FIG. 6B, the ion beam 101 implants through the apertures 405 in the mask 404 in a second position where the higher-dose implanted regions 600 correspond to that portion of the velocity profile having a slower scan speed ($S_2$). Thus, FIG. 6B illustrates the higher dose implanted regions 600, lower-dose implanted regions 601 from the first position and the undoped regions 602 corresponding to the areas of the mask 405a between the apertures 405.

The substrate 100 may be scanned behind the mask 404 continuously. However, as seen in FIG. 5, the substrate 100 scans more slowly at the second speed when the ion beam 101 is implanting the higher-dose implanted regions 600 as compared to the lower-dose regions 601 of the substrate 100. Thus, the substrate 100 moves faster at the first speed between the first position and second position (not illustrated) than while implanting in the first position and second position illustrated in FIGS. 6A-6B. Since the mask is fixed with respect to the ion beam 101, there is no need to move the mask with the substrate during scanning of the substrate which provides increased manufacturing throughput especially at lower dose levels.

Figure 6C:
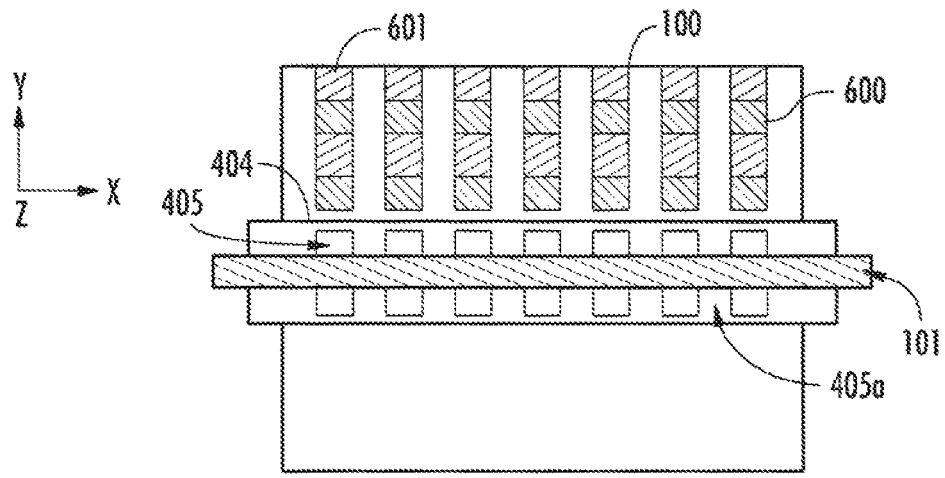
Figure 6D:
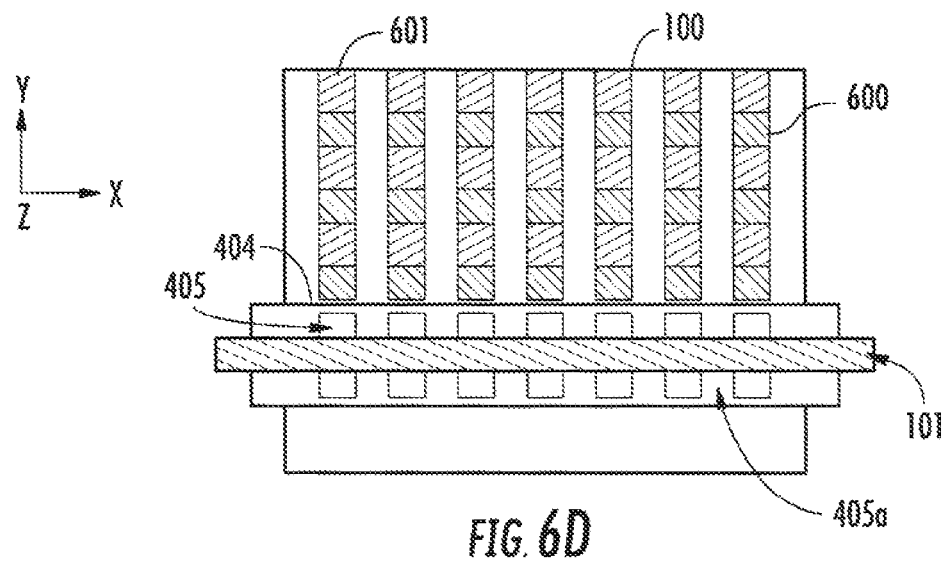
Figure 6E:
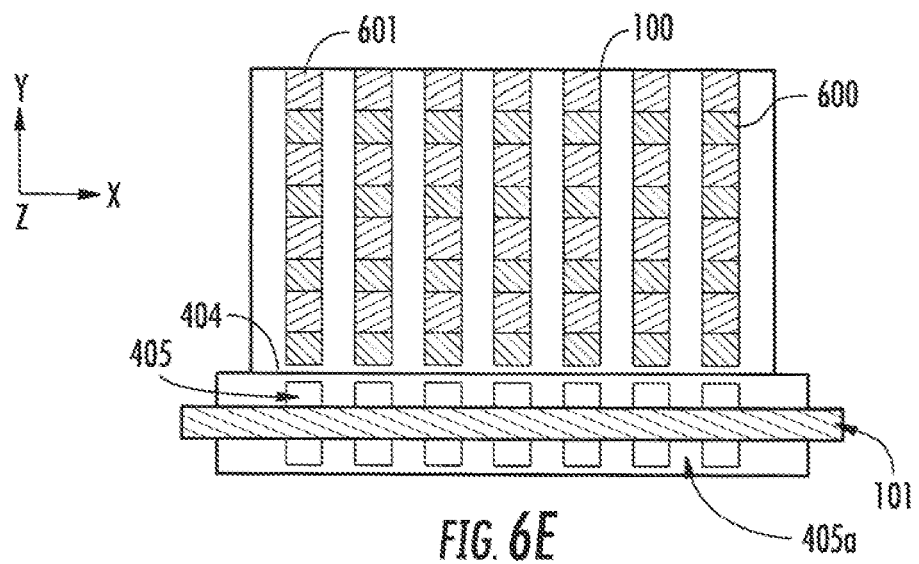
Figure 7:
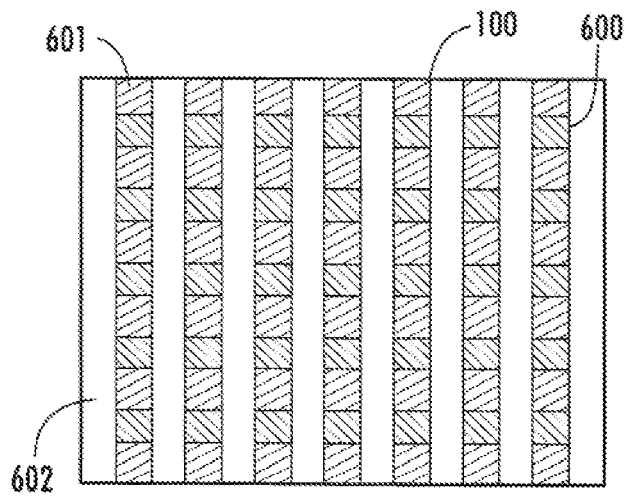
FIG. 7 is a front perspective view of a substrate that results from the implant method illustrated in FIGS. 6A-6E in accordance with an embodiment of the present disclosure.

FIGS. 6C-6E represent the results of ion beam 101 implanted through apertures 405 in the mask 404 in a third position, fourth, position, and fifth position respectively corresponding to portions of the substrate 100 as it moves in the exemplary Y direction. FIG. 7 is a front perspective view of a substrate that results from the implant method illustrated in FIGS. 6A-6E. As illustrated in FIG. 7, a series of higher-dose implanted regions 600 have been formed in the substrate 100 with lower-dose implanted regions 601 in between. Undoped regions 602 correspond to portions of the substrate that are aligned behind, the mask areas 405a, 405b and 405c between the apertures 405 and at the periphery of the mask 40. The higher-dose implanted regions 600 may correspond to future point contacts in a solar cell that are added during metallization step. Since the mask 404 is stationary or fixed in FIGS. 6A-6E, this results in less-complicated cooling and grounding connections because the mask 404 does not move like the substrate 100. This also may improve the effectiveness and reliability of the cooling and grounding connections for the mask 404.

The substrate 100 of FIG. 7 could be produced by a shadow mask, such as mask 104, that scans with the substrate 100. However, the entire substrate 100 would have to remain in the ion beam 101 for the same amount of time as each of the implant steps shown in FIGS. 6A-6E. This means that the ion beam 101 dose required to perform the implants would be increased by a factor of $S_h/((B_h)(n))$ where $S_h$ is the height of the substrate 100, $B_h$ is the height of the ion beam 101, and n is the number of rows of the higher-dose implanted regions 600. For an ion beam 101 with a height of 4 mm, a substrate 100 height of 156 mm, and four rows of higher-dose implanted regions 600, the total dose could be ten times lower using the method illustrated in FIGS. 6A-6E than an implant method with a scanning mask 104. This reduced dose results in increased throughput and lower production costs. The reduced dose also may lead to less thermal load on the mask 404.

The lower-dose implanted regions 601 between the higher-dose implanted regions 600 may lower the series resistance of any resulting solar cell. Majority carriers must be transported from generation sites to the contacts and the resistance these encounter during transportation reduces the output of a solar cell. For majority carriers that originate between the contact points, a slightly higher dose between the contacts will lower the resistance. This may result in better internal series resistance in the solar cell.

The present disclosure is not to be limited in scope by the specific embodiments described herein. Indeed, other various embodiments of and modifications to present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implanter for implanting a substrate with a material comprising:
   an ion source;
   a beam line assembly configured to extract ions from said ion source to form an ion beam and direct said ion beam toward a substrate disposed on a substrate support;
   a mask disposed in front of said substrate, said mask having a plurality of apertures to allow respective portions of said ion beam through said mask toward said substrate; and
   a scanning assembly configured to move said substrate support with respect to said ion beam at a first scan rate when first portions of said substrate are aligned with said plurality of apertures and at a second scan rate when second portions of said substrate are aligned with said plurality of apertures wherein said first scan rate is faster than said second scan rate and said second scan rate corresponds to point contacts of a solar cell.

2. The ion implanter of claim 1 wherein said mask is fixedly disposed, with respect to said ion beam, in front of said substrate.

3. The ion implanter of claim 1 wherein said ion beam has a height dimension, said apertures having a length corresponding to said height dimension.

4. The ion implanter of claim 1 further comprising a cooling subassembly connected to said mask for maintaining a temperature of said mask.

5. The ion implanter of claim 1 wherein said second portions of said substrate have a higher dose rate of ions from said ion beam as compared to said first portions of said substrate.

6. The ion implanter of claim 5 wherein said second portions of said substrate correspond to said point contacts in said solar cell.

* * * * *